(12) United States Patent
Thorson

(10) Patent No.: US 10,321,251 B1
(45) Date of Patent: Jun. 11, 2019

(54) TECHNIQUES OF PERFORMING MICROPHONE SWITCHING FOR A MULTI-MICROPHONE EQUIPPED DEVICE

(71) Applicant: Republic Wireless, Inc., Raleigh, NC (US)

(72) Inventor: Dean Thorson, Grayslake, IL (US)

(73) Assignee: Republic Wireless, Inc., Raleigh, NC (US)

( * ) Notice: Subject to any disclaimer, the term of this patent is extended or adjusted under 35 U.S.C. 154(b) by 0 days.

(21) Appl. No.: 16/010,639

(22) Filed: Jun. 18, 2018

(51) Int. Cl.
| G06F 5/10 | (2006.01) |
| H03G 1/00 | (2006.01) |
| H04M 3/56 | (2006.01) |
| H04R 1/40 | (2006.01) |
| H04R 3/00 | (2006.01) |
| H04R 29/00 | (2006.01) |
| G06F 12/1081 | (2016.01) |

(52) U.S. Cl.
CPC .............. H04R 29/005 (2013.01); G06F 5/10 (2013.01); G06F 12/1081 (2013.01); H03G 1/0088 (2013.01); H04M 3/56 (2013.01); H04R 1/406 (2013.01); H04R 3/00 (2013.01)

(58) Field of Classification Search
CPC ......... H04M 3/56; H04R 3/00; H04R 29/005; H04R 1/406; G06F 12/1081; G06F 5/10; H03G 1/0088
See application file for complete search history.

(56) References Cited

U.S. PATENT DOCUMENTS

| 5,297,210 A * | 3/1994 | Julstrom ................ H04R 3/005 379/206.01 |
| 5,625,697 A * | 4/1997 | Bowen ..................... H04M 9/08 367/126 |
| 7,242,421 B2 * | 7/2007 | Center, Jr. ............. H04N 7/147 348/14.1 |
| 2010/0150364 A1 * | 6/2010 | Buck ....................... G01S 3/807 381/66 |
| 2011/0029109 A1 * | 2/2011 | Thomsen ................ H03F 3/187 700/94 |
| 2013/0110521 A1 * | 5/2013 | Hwang ............... H04W 52/028 704/500 |

FOREIGN PATENT DOCUMENTS

CN     101268715 B  *  9/2008  .............. H04M 3/56

OTHER PUBLICATIONS

Tiete et al, SoundCompass A distributed MEMS Microphone Array Based Sensor for Sound Source Localization, 2014.*

* cited by examiner

Primary Examiner — Davetta W Goins
Assistant Examiner — Kuassi A Ganmavo
(74) Attorney, Agent, or Firm — Gregory Stephens (57) ABSTRACT

Various embodiments describe techniques for switching microphones in a multiple microphone system. The techniques incorporate sampling audio signals from multiple microphones, determining a microphone that has the greatest incoming amplitude during the analysis window, and switching the microphone to that greatest amplitude microphone. The transition point for switching microphones may be determined when either the amplitude of the incoming signal is within an error bound of zero or at a "zero-crossing" in the input amplitude stream.

15 Claims, 5 Drawing Sheets

TECHNIQUES OF PERFORMING MICROPHONE SWITCHING FOR A MULTI-MICROPHONE EQUIPPED DEVICE

BACKGROUND

Many devices exist today that take voice input via a plurality of microphones oriented about the device. These devices range from conference phones, smartphones and smart speakers to other home appliances. A typical device may include four or more microphones. A device's microphone array may be set to cover all parts of a room. However, as a person moves about in a room, one microphone of the array may better detect that person's voice than the other microphones. Similarly, if there are multiple people using the device simultaneously, different microphones may be better for detecting different people. For the highest quality audio processing, the device should use the microphone that best receives the current input. This may entail strategically switching from one microphone to another.

What is needed is a technique to provide more robust switching among multiple microphones on a device when there are multiple voices and/or a single voice that is moving around.

DETAILED DESCRIPTION

Embodiments described herein may be directed to techniques for facilitating dynamic microphone switching for an electronic device equipped with multiple microphones.

The systems, devices, and methods described herein may be embodied in and performed by electronic devices, telecommunication endpoint devices, network servers, telecommunications network servers, other computer devices including combinations thereof, and software instructions executed by some or all of such devices, as will be explained in detail below.

With general reference to notations and nomenclature used herein, one or more portions of the detailed description which follows may be presented in terms of program procedures executed on a computer or network of computers. These procedural descriptions and representations are used by those skilled in the art to most effectively convey the substances of their work to others skilled in the art. A procedure is here, and generally, conceived to be a self-consistent sequence of operations leading to a desired result. These operations are those requiring physical manipulations of physical quantities. Usually, though not necessarily, these quantities take the form of electrical, magnetic, or optical signals capable of being stored, transferred, combined, compared, and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to those quantities.

Further, these manipulations are often referred to in terms, such as adding or comparing, which are commonly associated with mental operations performed by a human operator. However, no such capability of a human operator is necessary, or desirable in most cases, in any of the operations described herein that form part of one or more embodiments. Rather, these operations are machine operations. Useful machines for performing operations of various embodiments include general purpose digital computers as selectively activated or configured by a computer program stored within that is written in accordance with the teachings herein, and include apparatus specially constructed for the required purpose. Various embodiments also relate to apparatus or systems for performing these operations. These apparatuses may be specially constructed for the required purpose or may include a general-purpose computer. The required structure for a variety of these machines will be apparent from the description given.

Reference is now made to the drawings, wherein like reference numerals are used to refer to like elements throughout. In the following description, for purpose of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modification, equivalents, and alternatives within the scope of the claims.

Figure 1:
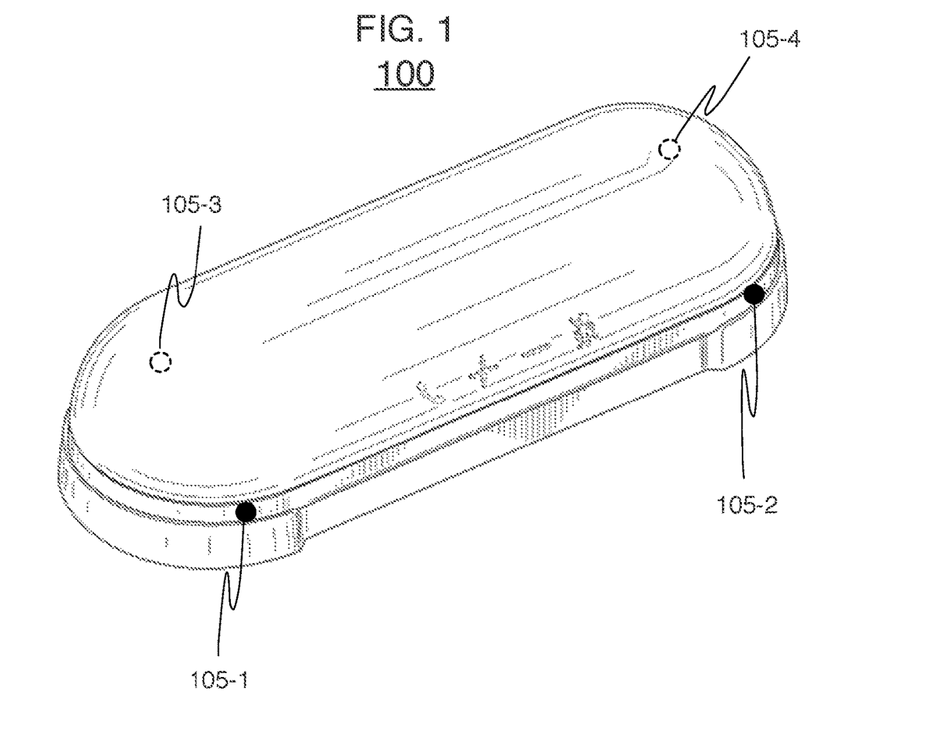
FIGS. 1 and 2 illustrates an embodiment of an electronic device with an array of microphones.
Figure 2:
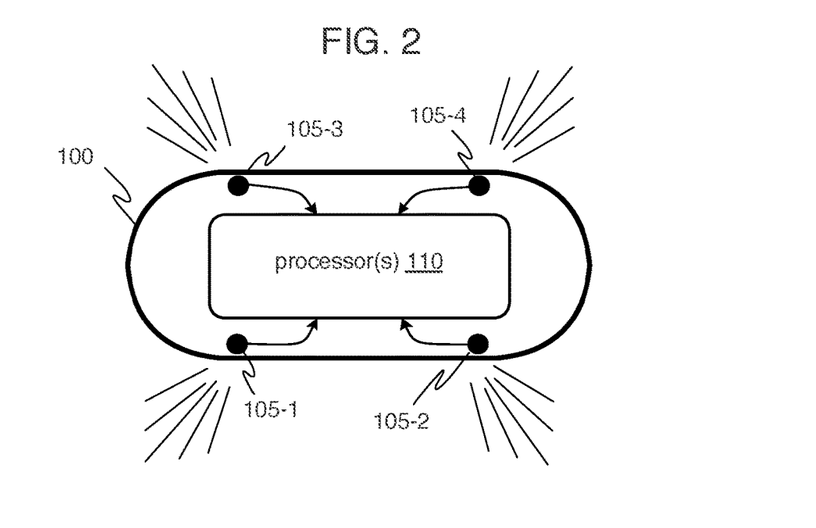

FIGS. 1 and 2 illustrate an embodiment of an electronic device 100 with an array of microphones 105-1 to 105-4. The term electronic device 100 may be used to describe a device capable of inbound and/or outbound telecommunications, asynchronous voice communications, smart speaker functions, etc. Electronic device 100 may, but need not, describe a device that can be voice activated or voice controlled. The electronic device 100 may further comprise one or more microphone sensors 105-1, 105-2, 105-3, and 105-4 distributed on or about the electronic device 100. Each of these microphones 105-1, 105-2, 105-3, and 105-4 may be better suited than the others when accepting audio input depending on the location of the audio input source relative to the electronic device 100. For instance, the average amplitude of an input audio signal may be greater at microphone 105-1 than at microphone 105-3 depending on the source of the audio signal. Many other embodiments and form factors for electronic devices having multiple microphones may be contemplated. The illustration of FIG. 1 is merely one non-limiting example. For instance, an electronic device may have fewer or greater than four microphones.

Within the electronic device 100, there may be one or more processors 110 including a digital signal processor (DSP) and/or an applications processor (AP). A digital signal processor (DSP) is a specialized microprocessor, with its architecture optimized for the operational needs of digital signal processing. Generally speaking, DSPs measure, filter, or compress continuous real-world analog signals. Most general-purpose microprocessors can also execute digital signal processing algorithms successfully, but a dedicated DSP has better power efficiency and battery management, making them more suitable in portable devices such as mobile phones or other portable electronic and communication devices.

An applications processor (AP) may be characterized as a system on a chip (SoC) designed to support applications running in a mobile operating system environment. An applications processor may provide a self-contained operating environment that delivers all system capabilities needed to support a device's applications, including memory management, graphics processing and multimedia decoding. Thus, it is more robust than a specialized DSP but also consumes more power.

One or more users may speak in the presence of electronic device 100 like that shown in FIGS. 1 and 2. The users may also move around while speaking.

Figure 3:
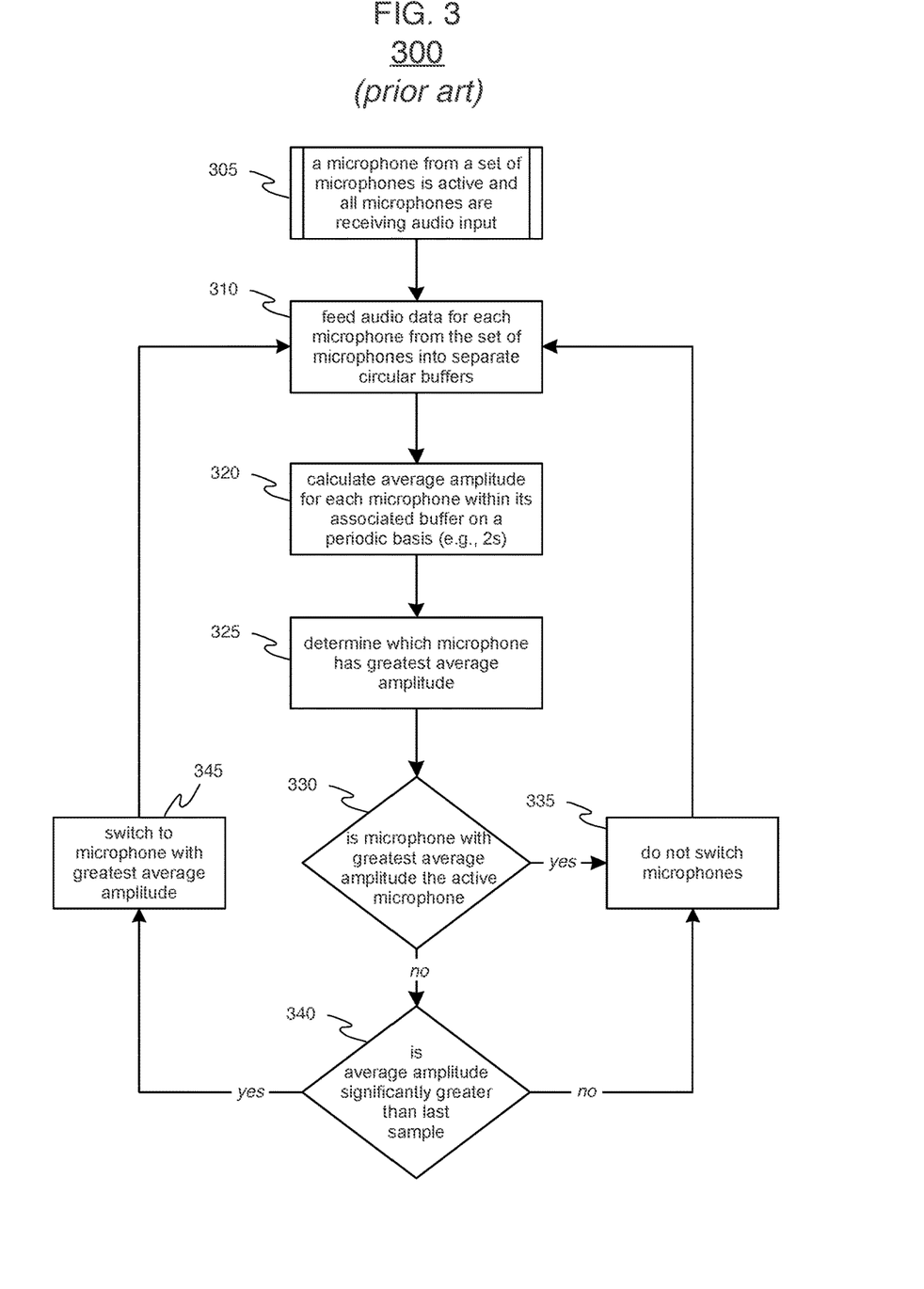
FIG. 3 illustrates a prior art embodiment of a first logic flow.

FIG. 3 illustrates an exemplary prior art logic flow 300 according to an embodiment. The logic flow 300 process may begin when two or more microphones (105-1 through 105-4) are all receiving input but only one may be being used as a source at step 305. Analog audio that is detected by each of the one or more microphones (105-1 through 105-4) on electronic device 100 may be fed into circular buffers where each microphone is associated with its own circular buffer at step 310. On a periodic basis, the amplitude for each microphone is calculated by processor 110 using the data in the respective circular buffers at step 320. The length of the period may be a design implementation but is illustrated at two seconds herein. The processor 110 may then determine which microphone (105-1 through 105-4) exhibited the greatest amplitude at step 325 using the data in the circular buffers associated with each microphone. The processor 110 then determines if the microphone exhibiting the greatest amplitude for the period in question is the same microphone that is currently active (i.e., in use), based on the last period's amplitude calculation at decision block 330. If the result of the determination in decision block 330 is that the active microphone is still the microphone with the greatest amplitude, then the switching algorithm will not switch the active microphone to another microphone at step 335. Control may then be returned to step 310 so that the overall process may repeat for the next batch of audio data within the circular buffers representing the next period.

If the result of the determination in decision block 330 is that the active microphone is not the microphone with the greatest amplitude then the switching algorithm will then determine, via processor 110, whether the amplitude for the non-active microphone is significantly greater than the amplitude of the active microphone at decision block 340. If the result of the determination in decision block 340 is that the microphone with the greatest amplitude is not significantly greater than the amplitude of the active microphone, then the switching algorithm will not switch the active microphone to another microphone at step 335. Control may then be returned to step 310 so that the overall process may repeat for the next batch of audio data within the circular buffers representing the next period.

If the result of the determination in decision block 340 is that the microphone with the greatest amplitude is significantly greater than the amplitude of the active microphone, then the switching algorithm will switch the active microphone to the microphone with the greatest amplitude at step 345. Control may then be returned to step 310 so that the overall process may repeat for the next batch of audio data within the circular buffers representing the next period.

When comparing the current amplitude to the previous amplitude, the term significantly greater may also be a design implementation but typically may refer to a difference of between 3-9 decibels.

Figure 4:
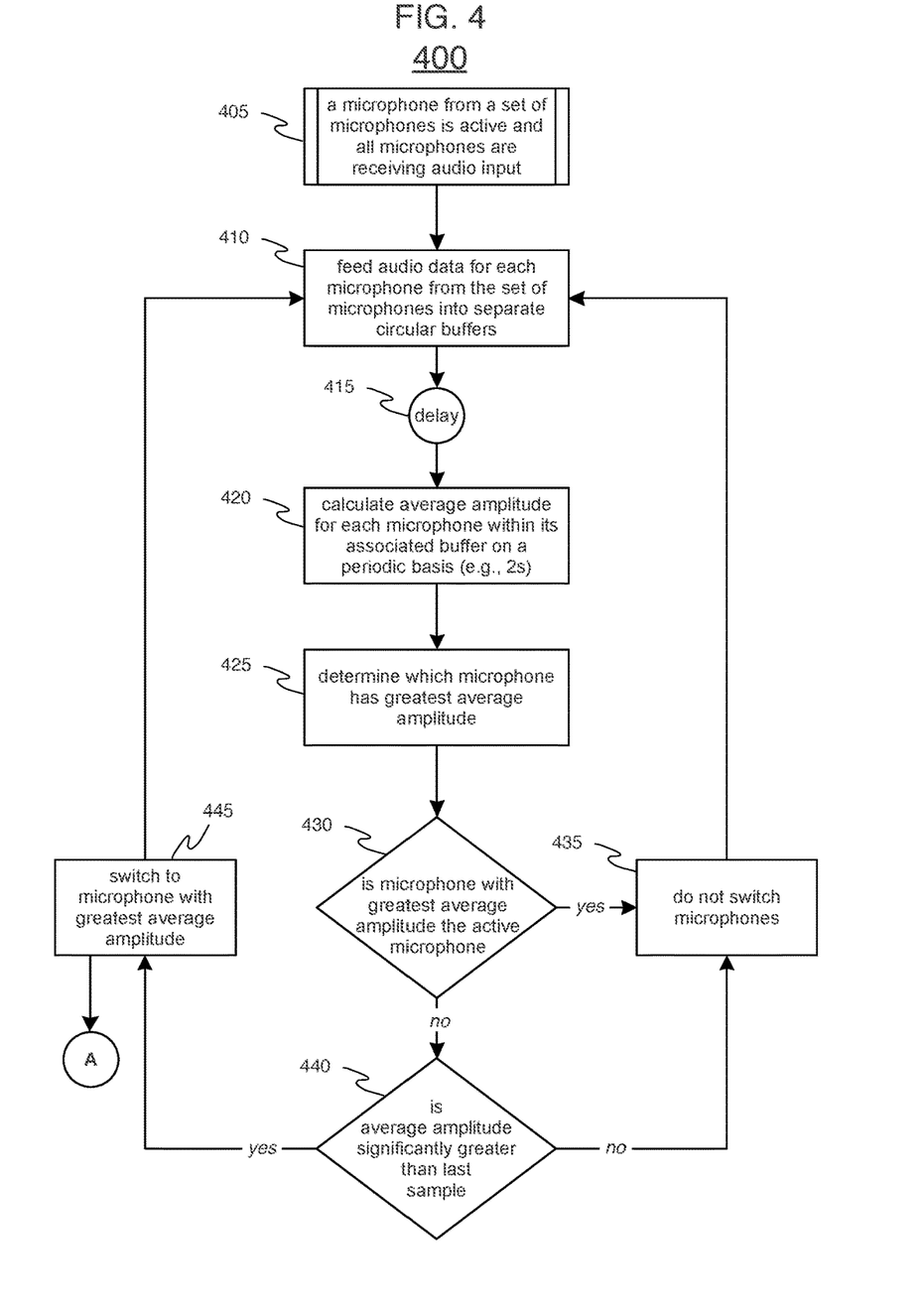
FIG. 4 illustrates an embodiment of a second logic flow.

FIG. 4 illustrates an exemplary logic flow 400 according to an embodiment. The logic flow 400 may be representative of some or all of the operations executed by one or more embodiments described herein for processing audio signals received via one or more microphones 105-1, 105-2, 105-3, and 105-4. Further, the logic flow 400 may be performed by circuitry and one or more components discussed herein, such as those shown in FIGS. 1 and 2.

The logic flow 400 is almost but not entirely identical to that described in FIG. 3 above. The difference between FIG. 3 and FIG. 4 is that a processing delay 415 is inserted into the flow between step 410 (feeding data for each microphone from the set of microphones into separate circular buffers) and step 420 (calculating the average amplitude for each microphone within its associated buffer on a periodic basis). This delay is specifically introduced to set up a transition window for performing a microphone switch as seamlessly as possible when conditions warrant.

The prior art of FIG. 3 performs a microphone switching function when the average amplitude of a microphone is significantly greater than the average amplitude of the current active microphone. However, that transition may be somewhat abrupt and occur in the middle of an audio signal. Such a transition may be noticeable to listeners on the other end. The techniques to be described in FIGS. 5A and 5B determine the best transition points for switching from the active microphone to the new microphone with the greater amplitude. The best transition points coincide with lulls or breaks in the audio signal. Such lulls or breaks may occur when there is a pause in a conversation or a change from one person speaking to another. Algorithmically, the lulls or breaks are characterized as zero crossings or near zero crossings of the audio signal when the audio input is mathematically modeled.

Both FIGS. 3 and 4 refer to circular buffers containing audio input data. For purposes of illustration, a circular buffer may be constructed using 16 bit samples with a 40 ms buffer depth for 640 samples per circular buffer. The delay (step 415) referred to above may be 20 ms to allow time for switching algorithms like those in FIGS. 5A and 5B to execute.

Figure 5A:
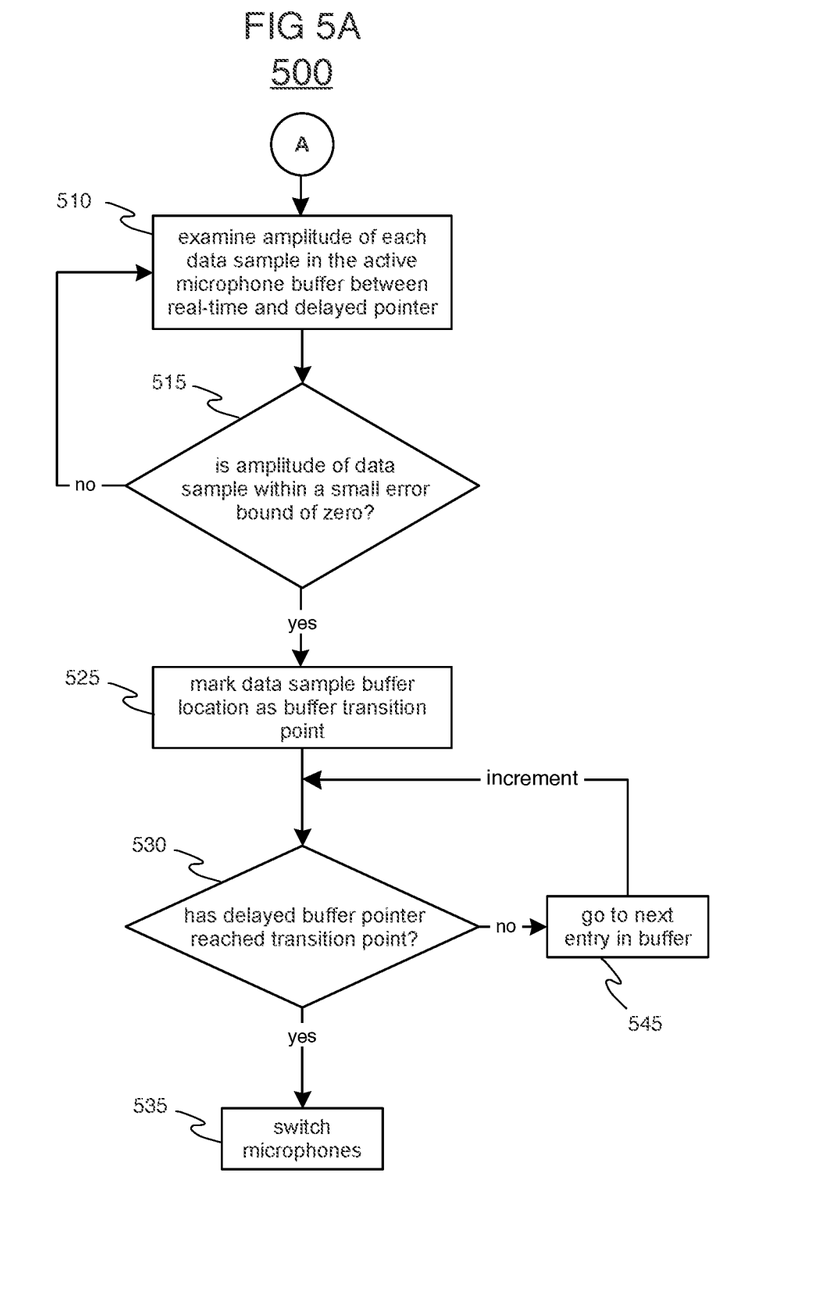
FIG. 5A illustrates an embodiment of a third logic flow.

FIG. 5A illustrates an exemplary logic flow 500 according to an embodiment. The logic flow 500 may be representative of some or all of the operations executed by one or more embodiments described herein for processing audio signals received via one or more microphones 105-1, 105-2, 105-3, and 105-4. Further, the logic flow 500 may be performed by circuitry and one or more components discussed herein, such as those shown in FIGS. 1 and 2.

The logic flow 500 picks up from the spot where the logic flow of FIG. 4 determined that a microphone switch is warranted in step 445. The 20 ms delay window moves the circular buffer retrieval pointer back in the stack by 320 samples (20 ms×16 ksamples/sec). In step 510, processor 110 may examine the amplitude of each of the data samples sequentially in the circular buffer for the active microphone between the real-time pointer and the delayed pointer. As described above, there are 320 of these samples based on an implementation of a 20 ms delay and 16 ksamples/sec. It should be noted and reiterated that the selection of a 20 ms delay and 16 ksamples/sec is a design choice and may be varied. Each of the data samples within the 20 ms window will have an amplitude that has been quantified. The audio samples in question, when plotted, are generally sinusoidal in nature meaning there may be points where a series of samples tend toward zero (either in the descending or ascending direction). The samples are "AC-coupled", meaning that the sample amplitude ranges from a positive maximum to a negative maximum, centered on zero. The amplitude of the signal, being sinusoidal in nature, will vary around the value zero.

In decision block 515, processor 110 may determine if the amplitude of the current sample is within a small error bound of zero. For instance, for a 16-bit system that varies from −32678 to +32767, one can set an acceptable error range of 0.1% meaning a data sample amplitude between −33 and +33 would be considered zero. Zero amplitudes, as mentioned above, correspond to lulls or breaks in the audio input and make for excellent transition points for switching microphones. If the decision block 515 does not return an amplitude within the error bound of zero (−33 to +33), control returns to step 510 and the next sample's amplitude is evaluated.

If the decision block 515 does return an amplitude within the error bound of zero (−33 to +33), the location of that data sample is marked as a buffer transition point at step 525. Decision block 530 then determines whether the delayed buffer pointer has reached the previously marked buffer transition point. If the delayed buffer pointer has not yet reached the previously marked buffer transition point, the process increments to the next entry in the buffer at step 545 before repeating decision block 530. But, if the delayed buffer pointer has reached the previously marked buffer transition point, the switching algorithm executes at step 535 causing the microphone to switch from the active microphone to the microphone having the greatest average amplitude as determined in step 445 of FIG. 4.

Figure 5B:
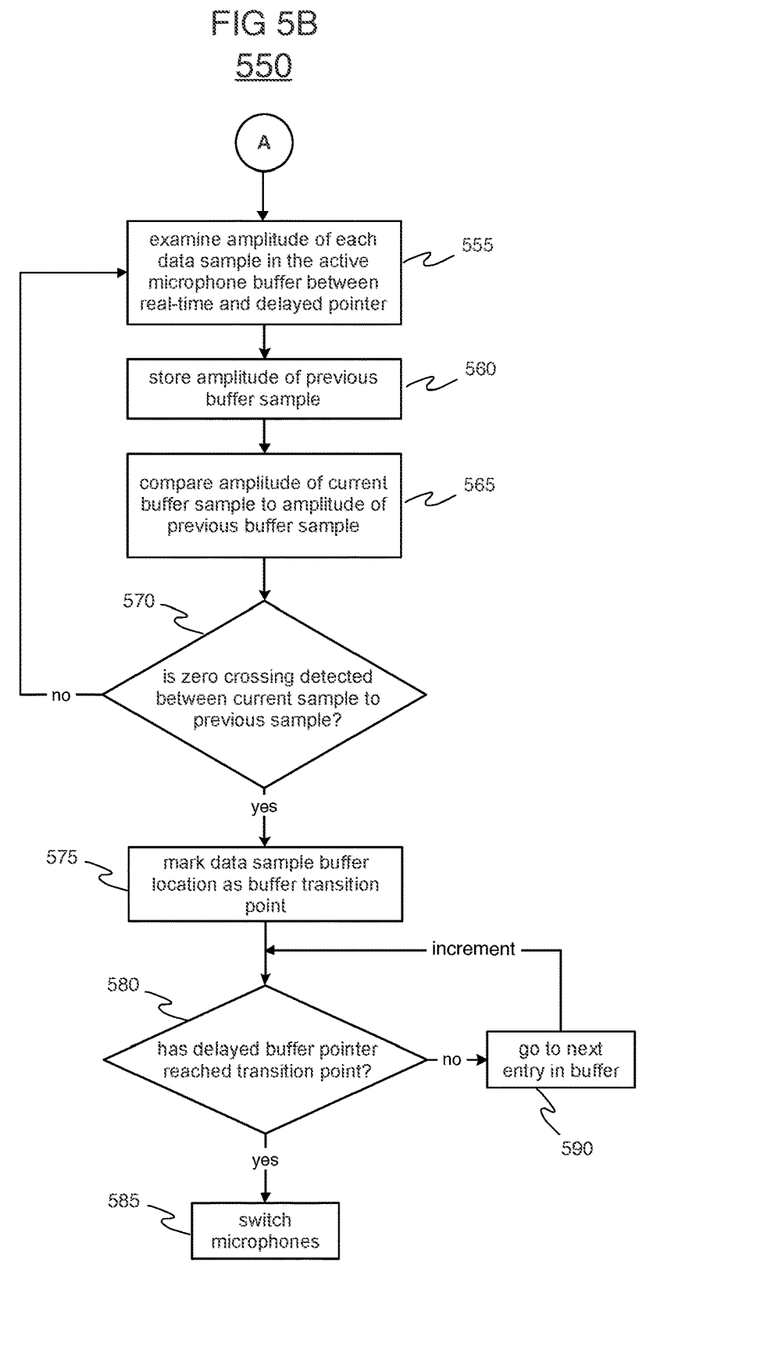
FIG. 5B illustrates an embodiment of a fourth logic flow.

FIG. 5B illustrates an exemplary logic flow 550 according to an embodiment. The logic flow 550 may be representative of some or all of the operations executed by one or more embodiments described herein for processing audio signals received via one or more microphones 105-1, 105-2, 105-3, and 105-4. Further, the logic flow 550 may be performed by circuitry and one or more components discussed herein, such as those shown in FIGS. 1 and 2.

Just as in FIG. 5A, the logic flow 550 picks up from the spot where the logic flow of FIG. 4 determined that a microphone switch is warranted in step 445. Also as described above, processor 110 may examine the amplitude of each of the data samples sequentially in the circular buffer for the active microphone between the real-time pointer and the delayed pointer in step 555. The amplitude of each sample may then be stored at step 560. In step 565, the processor 110 may compare the amplitude of the current sample to that of the previous sample. Decision block 570 looks for zero crossings meaning the previous sample was a positive amplitude while the current sample is a negative amplitude, or the previous sample was a negative amplitude and the current sample is a positive amplitude. Either case indicates that there was a zero crossing between the two samples. If there is not a zero crossing as determined in decision block 570, the process iterates to the next sample and repeats. If there is a zero crossing as determined in decision block 570, the data sample location is marked as a buffer transition point in step 575.

Decision block 580 then determines whether the delayed buffer pointer has reached the previously marked buffer transition point. If the delayed buffer pointer has not yet reached the previously marked buffer transition point, the process increments to the next entry in the buffer at step 590 before repeating decision block 580. But, if the delayed buffer pointer has reached the previously marked buffer transition point, the switching algorithm executes at step 585 causing the microphone to switch from the active microphone to the microphone having the greatest average amplitude as determined in step 445 of FIG. 4.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate arrays (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine-readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or rewriteable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

The invention claimed is:

1. A computer implemented method of switching an active microphone to another microphone on an electronic device comprising multiple microphones, the method comprising:
   receiving audio input into a set of microphones, only one microphone of the set of microphones being currently active;
   storing amplitude data corresponding to the audio input for each microphone in circular data buffers, wherein each microphone is associated with its own circular buffer;
   introducing a predetermined time delay into each circular buffer resulting in a real-time buffer pointer and a delayed buffer pointer;
   calculating an average amplitude for each microphone over a predetermined period using the amplitude data in each microphone's respective circular buffer;
   when the microphone with the greatest average amplitude is the not active microphone, determining whether the greatest average amplitude is significantly greater than the average amplitude for the active microphone;
   when the greatest average amplitude is significantly greater than the average amplitude for the active microphone, initiating a microphone switching algorithm comprising:
      sequentially examining the amplitude of each audio data sample in the circular buffer of the active microphone between the real-time buffer pointer and the delayed buffer pointer;
      when the amplitude of an audio data sample is sufficiently close to zero, marking the buffer location as a buffer transition point; and
      when the delayed buffer pointer reaches the marked buffer location transition point, causing a microphone switch in which the active microphone switches to the microphone with the greatest average amplitude.

2. The method of claim 1, wherein the predetermined time delay is less than or equal to 100 ms.

3. The method of claim 1, wherein the predetermined period is less than or equal to 10 seconds.

4. The method of claim 1, wherein the significantly greater than the average amplitude is three (3) or more decibels.

5. The method of claim 1, wherein sufficiently close to zero is within plus or minus 0.1% of a maximum or minimum amplitude.

6. An apparatus, comprising:
   a memory;
   a set of microphones; and
   logic, at least a portion of which is implemented in circuitry coupled to the memory, the logic to:
      receive audio input into the set of microphones, only one microphone of the set of microphones being currently active;
      store amplitude data corresponding to the audio input for each microphone in circular data buffers, wherein each microphone is associated with its own circular buffer;
      introduce a predetermined time delay into each circular buffer resulting in a real-time buffer pointer and a delayed buffer pointer;
      calculate an average amplitude for each microphone over a predetermined period using the amplitude data in each microphone's respective circular buffer;
      when the microphone with the greatest average amplitude is the not active microphone, determine whether the greatest average amplitude is significantly greater than the average amplitude for the active microphone;
      when the greatest average amplitude is significantly greater than the average amplitude for the active microphone, initiate a microphone switching algorithm that:
         sequentially examines the amplitude of each audio data sample in the circular buffer of the active microphone between the real-time buffer pointer and the delayed buffer pointer;
         when the amplitude of an audio data sample is sufficiently close to zero, marks the buffer location as a buffer transition point; and
         when the delayed buffer pointer reaches the marked buffer location transition point, causes a microphone switch in which the active microphone switches to the microphone with the greatest average amplitude.

7. The apparatus of claim 6, wherein the predetermined time delay is less than or equal to 100 ms.

8. The apparatus of claim 6, wherein the predetermined period is less than or equal to 10 seconds.

9. The apparatus of claim 6, wherein the significantly greater than the average amplitude is three (3) or more decibels.

10. The apparatus of claim 6, wherein sufficiently close to zero is within plus or minus 0.1% of a maximum or minimum amplitude.

11. At least one non-transitory computer-readable medium comprising a set of instructions that, in response to being executed by a processor circuit, cause the processor circuit to:
   receive audio input into a set of microphones, only one microphone of the set of microphones being currently active;
   store amplitude data corresponding to the audio input for each microphone in circular data buffers, wherein each microphone is associated with its own circular buffer;
   introduce a predetermined time delay into each circular buffer resulting in a real-time buffer pointer and a delayed buffer pointer;
   calculate an average amplitude for each microphone over a predetermined period using the amplitude data in each microphone's respective circular buffer;
   when the microphone with the greatest average amplitude is the not active microphone, determine whether the greatest average amplitude is significantly greater than the average amplitude for the active microphone;
   when the greatest average amplitude is significantly greater than the average amplitude for the active microphone, initiate a microphone switching algorithm that:

sequentially examines the amplitude of each audio data sample in the circular buffer of the active microphone between the real-time buffer pointer and the delayed buffer pointer;

when the amplitude of an audio data sample is sufficiently close to zero, marks the buffer location as a buffer transition point; and when the delayed buffer pointer reaches the marked buffer location transition point, causes a microphone switch in which the active microphone switches to the microphone with the greatest average amplitude.

12. The at least one non-transitory computer-readable medium of claim 11, wherein the predetermined time delay is less than or equal to 100 ms.

13. The at least one non-transitory computer-readable medium of claim 11, wherein the predetermined period is less than or equal to 10 seconds.

14. The at least one non-transitory computer-readable medium of claim 11, wherein the significantly greater than the average amplitude is three (3) or more decibels.

15. The at least one non-transitory computer-readable medium of claim 11, wherein sufficiently close to zero is within plus or minus 0.1% of a maximum or minimum amplitude.

* * * * *